US009666247B2

United States Patent
Ahn et al.

(10) Patent No.: US 9,666,247 B2
(45) Date of Patent: *May 30, 2017

(54) SEMICONDUCTOR MEMORY APPARATUS

(71) Applicant: SK hynix Inc., Icheon-si Gyeonggi-do (KR)

(72) Inventors: Chang Yong Ahn, Icheon-si (KR); Ho Seok Em, Icheon-si (KR)

(73) Assignee: SK hynix Inc., Icheon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/156,919

(22) Filed: May 17, 2016

(65) Prior Publication Data
US 2016/0260464 A1 Sep. 8, 2016

Related U.S. Application Data

(63) Continuation of application No. 14/562,936, filed on Dec. 8, 2014, now Pat. No. 9,368,171.

(30) Foreign Application Priority Data

Aug. 28, 2014 (KR) .......................... 10-2014-0113435

(51) Int. Cl.
*G11C 7/06* (2006.01)
*G11C 7/10* (2006.01)
*G11C 7/22* (2006.01)
*G11C 7/12* (2006.01)
*G11C 13/00* (2006.01)
(Continued)

(52) U.S. Cl.
CPC ............ *G11C 7/062* (2013.01); *G11C 7/1063* (2013.01); *G11C 7/12* (2013.01); *G11C 7/22* (2013.01); *G11C 11/1675* (2013.01); *G11C 11/1677* (2013.01); *G11C 13/0064* (2013.01); *G11C 13/0069* (2013.01); *G11C 16/10* (2013.01); *G11C 16/3459* (2013.01); *G11C 2013/0042* (2013.01); *G11C 2207/229* (2013.01)

(58) Field of Classification Search
CPC .............. G11C 7/22; G11C 7/062; G11C 7/12
See application file for complete search history.

(56) References Cited

U.S. PATENT DOCUMENTS

| 7,535,747 | B2 * | 5/2009 | Lee | ................... G11C 11/5678 365/113 |
| 7,738,288 | B2 * | 6/2010 | Kang | ................ G11C 13/0004 365/158 |

(Continued)

FOREIGN PATENT DOCUMENTS

| KR | 100673900 B1 | 1/2007 |
| KR | 1020110027939 A | 3/2011 |

*Primary Examiner* — Tri Hoang
(74) *Attorney, Agent, or Firm* — William Park & Associates Ltd.

(57) ABSTRACT

A semiconductor memory apparatus may include a write driver, a data sensing section, and a programming control section. The write driver may write an input data into a memory cell in response to a write signal. The data sensing section may generate a comparison flag signal by comparing an output data outputted from the memory cell with a reference voltage in response to a verification read signal. The programming control section may generate the write signal for an initial write operation and the verification read signal as soon as the comparison flag signal is enabled.

19 Claims, 11 Drawing Sheets

(51) Int. Cl.
     *G11C 16/10*     (2006.01)
     *G11C 16/34*     (2006.01)
     *G11C 11/16*     (2006.01)

(56) References Cited

U.S. PATENT DOCUMENTS

| | | | | |
|---|---|---|---|---|
| 8,264,873 B2* | 9/2012 | Kim | ................... | G11C 13/0004 |
| | | | | 365/148 |
| 8,395,924 B2* | 3/2013 | Lee | ......................... | G11C 8/14 |
| | | | | 365/148 |
| 2013/0163348 A1* | 6/2013 | Yoon | ................... | G11C 29/026 |
| | | | | 365/189.05 |
| 2014/0164682 A1* | 6/2014 | Lee | ................... | G11C 16/3436 |
| | | | | 711/103 |

\* cited by examiner

SEMICONDUCTOR MEMORY APPARATUS

CROSS-REFERENCES TO RELATED APPLICATION

The present application is a continuation application of U.S. patent application Ser. No. 14/562,936, filed on Aug. 12, 2014, issued on Jun. 14, 2016 as U.S. Pat. No. 9,368,171, and titled "SEMICONDUCTOR MEMORY APPARATUS", which is incorporated herein by reference in its entirety.

BACKGROUND

1. Technical Field

Various embodiments generally relate to a semiconductor apparatus, and more particularly, to a program operation of a semiconductor memory apparatus.

2. Related Art

DRAM (Dynamic Random Access Memory) is used mainly as a memory of an electronic device since it promptly accesses a target memory cell and makes it easier to store and readout data. However, a capacitor included in the DRAM cell has a leakage characteristic. The DRAM is a volatile memory, and loses stored data when the power supply is cut-off.

To overcome the weaknesses of the DRAM, a non-volatile memory device may be used instead to keep stored data even when the power supply is cut-off. Examples of the non-volatile memory device are a flash memory, a phase change random access memory (PCRAM), a resistive random access memory (ReRAM), a ferroelectric random access memory (FeRAM), a magnetic random access memory (MRAM), and a Spin Transfer Torque random access memory (STTRAM). A memory cell of the non-volatile semiconductor memory apparatus has a non-volatility characteristic by keeping stored data even when the power supply is cut-off.

An operation of storing data into the memory cell of the non-volatile semiconductor memory apparatus is generally referred to as a write operation or a program operation. A verification read operation is performed in the non-volatile semiconductor memory apparatus for verifying whether an intended data is stored in the memory cell. According to the result of the verification read operation, the write operation or the program operation is finished or performed again. Compared with the DRAM, the repetition of the program operation and the verification read operation for storing data degrades the overall operation speed of the non-volatile semiconductor memory apparatus.

SUMMARY

In an embodiment, a semiconductor memory apparatus may include a write driver configured to write an input data into a memory cell in response to a write signal, and a data sensing section configured to generate a comparison flag signal by comparing an output data outputted from the memory cell with a reference voltage in response to a verification read signal. The semiconductor memory apparatus may include a programming control section configured to generate the write signal as soon as the comparison flag signal is enabled.

In an embodiment, a semiconductor memory apparatus may include a memory cell and may be configured to write an input data into the memory cell in response to a write signal, and generate a following write signal as soon as a comparison flag signal is at a predetermined level after comparing an output data outputted from the memory cell with a reference voltage. The pulse duration of the following write signal may be adjusted based on the comparison flag signal.

DETAILED DESCRIPTION

Hereinafter, a various embodiments of semiconductor apparatuses will be described below with reference to the accompanying drawings.

Various embodiments may be provided for a semiconductor memory apparatus capable of performing a following program operation as soon as the verification read operation finishes.

Further, various embodiments may be provided to a semiconductor memory apparatus capable of adjusting an operation time of a following write operation based on an operation time of a verification read operation.

Figure 1:
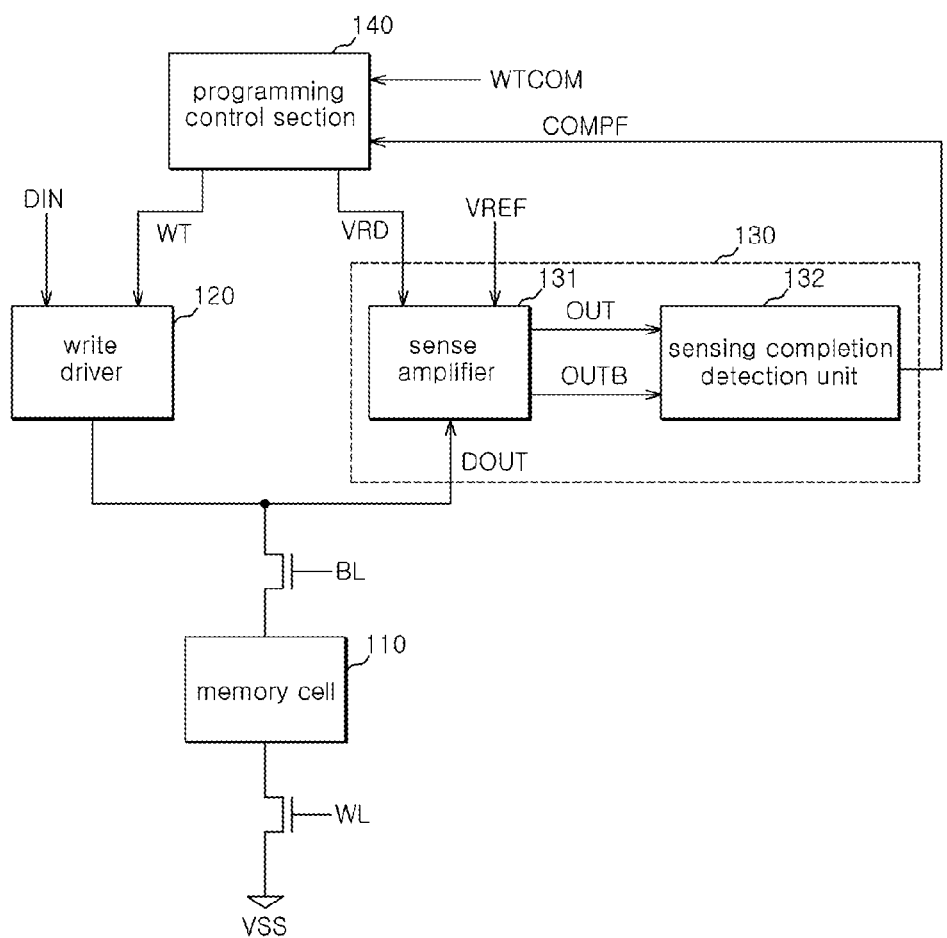
FIG. 1 is a block diagram illustrating a representation of a semiconductor apparatus in accordance with an embodiment.

Referring to FIG. 1, the semiconductor memory apparatus 1 in accordance with an embodiment of the present disclosure may include a memory cell 110, a write driver 120, and a data sensing section 130. The semiconductor memory apparatus 1 may include a programming control section 140.

The semiconductor memory apparatus 1 may be a non-volatile memory apparatus. The memory cell 110 may be a memory device for storing data, and a non-volatile memory cell. The memory cell 110 may be one of at least a flash memory cell, a PCRAM cell, a ReRAM cell, a FeRAM cell, a MRAM cell, and a STTRAM cell, which do not limit the scope of the present disclosure. The memory cell 110 may be accessed when a particular bit line and a particular word line is selected. The memory cell 110 may be a transistor serially coupled to each column switch and row switch. When a particular bit line BL and a particular word line WL is electrically coupled to the memory cell 110, the column switch and the row switch are turned on and the memory cell 110 may be electrically coupled to the write driver 120 or the data sensing section 130. Although not illustrated in FIG. 1, the semiconductor memory apparatus 1 may include a memory array comprising a plurality of memory cells, a plurality of bit lines, and a plurality of word lines. The memory cell 110 may be electrically coupled to a ground voltage VSS terminal.

The write driver 120 may write an input data DIN into the memory cell 110 in response to a write signal WT. The write driver 120 may include a latch for receiving and storing the input data DIN included in write operations. The write operations may be performed numerous amounts of times.

The data sensing section 130 may read data stored in the memory cell 110 in response to a verification read signal VRD. The data sensing section 130 may generate a comparison flag signal COMPF by differentially amplifying a reference voltage VREF and data stored in the memory cell 110. A level of the reference voltage VREF may vary according to a level of the data stored in the memory cell 110. This concept of a level of the reference voltage VREF potentially varying according to the level of data stored in the memory cell 110 will be described later.

The data sensing section 130 may include a sense amplifier 131 and a sensing completion detection unit 132. The sense amplifier 131 may generate output signals OUT and OUTB. The output signals OUT and OUTB may be generated by differentially amplifying the reference voltage VREF and the data stored in the memory cell 110 in response to the verification read signal VRD. The data stored in the memory cell 110 may be outputted to the sense amplifier 131 as output data DOUT. The output data DOUT may be one of voltage and current varying according to the resistance value of the memory cell 110, and may have a voltage level corresponding to the data stored in the memory cell 110. The output signals OUT and OUTB may be outputted as a couple of signals. The sensing completion detection unit 132 may generate the comparison flag signal COMPF. The comparison flag signal COMPF may be generated by detecting a change in the level of the output signals OUT and OUTB. The sensing completion detection unit 132 may enable the comparison flag signal COMPF as soon as the sensing completion detection unit 132 detects the level change of the output signals OUT and OUTB. When the sense amplifier 131 detects the level difference between the output data DOUT and the reference voltage VREF, the level of the output signals OUT and OUTB may be changed and the sensing completion detection unit 132 may enable the comparison flag signal COMPF as soon as sensing completion detection unit 132 detects the level change of the output signals OUT and OUTB.

The semiconductor memory apparatus 1 may perform the programming operation to write data into the memory cell 110. The write operation and the verification read operation may be alternately performed for the programming operation. For example, when the semiconductor memory apparatus 1 writes data at a particular level into the memory cell 110, the semiconductor memory apparatus 1 may perform a first write operation for writing the data at the particular level into the memory cell 110 through the write driver 120. When the first write operation is completed, the semiconductor memory apparatus 1 may perform a first verification read operation. Performing the first verification read operation includes the data sensing section 130 reading the data stored in the memory cell 110 and determining whether or not the output data DOUT corresponds to the input data DIN. When the output data DOUT does not correspond to the input data DIN, the semiconductor memory apparatus 1 may perform a second write operation. The semiconductor memory apparatus 1 may perform a second verification read operation when the second write operation is completed. The semiconductor memory apparatus 1 may repeatedly perform the write operation and the verification read operation until the data sensing section 130 determines that the output data DOUT corresponds to the input data DIN or substantially corresponds to the input data DIN. When the output data DOUT substantially corresponds to the input data DIN, the semiconductor memory apparatus 1 may finish the programming operation for storing the data at the particular level into the memory cell 110.

The programming control section 140 may generate the write signal WT for the initial write operation in response to a write command WTCOM. Also, the programming control section 140 may generate the verification read signal VRD. The programming control section 140 may enable the verification read signal VRD in response to disablement of the write signal WT. The programming control section 140 may generate the write signal WT for a following write operation in response to the comparison flag signal COMPF. The programming control section 140 may generate the write signal WT for the following write operation as soon as the comparison flag signal COMPF is enabled. The time for completion of the verification read operation and the time delay which the following write operation is started after the completion of the verification read operation may be reduced since the programming control section 140 generates the write signal WT for the following write operation as soon as the comparison flag signal COMPF is enabled.

Figure 2:
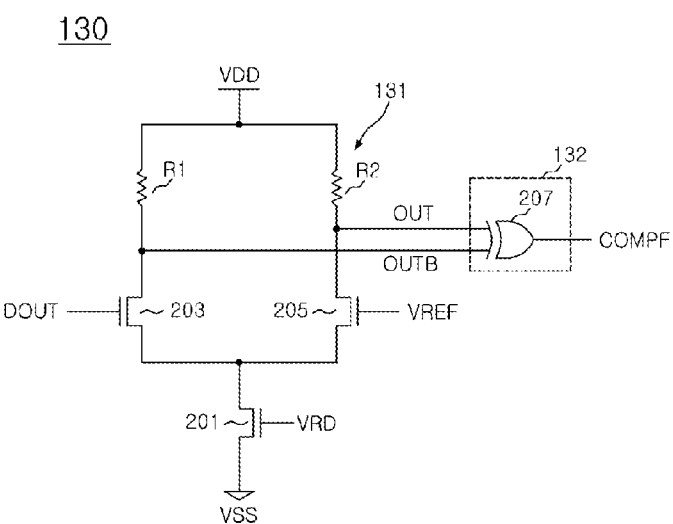
FIG. 2 is a circuit diagram illustrating a representation of a data sensing section illustrated in FIG. 1.

FIG. 2 is a circuit diagram illustrating a representation of the data sensing section 130 illustrated in FIG. 1. Referring to FIG. 2, the sense amplifier 131 may include a differential amplifier. The sense amplifier 131 may include first to third transistors 201 to 205. The gate of the first transistor 201 may receive the verification read signal VRD. The gate of the second transistor 203 may receive the output data DOUT. The gate of the third transistor 205 may receive the reference voltage VREF. The first transistor 201 may be turned on and may form a current path for the differential amplifier when the verification read signal VRD is enabled. The voltage levels of the drains of the second and third transistors 203 and 205 may change, relatively, according to the levels of the output data DOUT and the reference voltage VREF. For example, when the level of the output data DOUT is higher than the level of the reference voltage VREF, the voltage level of the drain of the second transistor 203 may be relatively lower than the voltage level of the drain of the third transistor 205 and the second and third transistors 203 and 205 may output the output signal OUTB having a low level and the output signal OUT having a high level, respectively. When the level of the output data DOUT is lower than the level of the reference voltage VREF, the voltage level of the drain of the second transistor 203 may be relatively higher than the voltage level of the drain of the third transistor 205 and the second and third transistors 203 and 205 may output the output signal OUTB having a high level and the output signal OUT having a low level, respectively. Time required for the level changes of the output signals OUT and OUTB may depend on the degree of turn-on of the second and third transistors 203 and 205. That is, the levels of the output signals OUT and OUTB may change promptly as the level difference between the output data DOUT and the reference voltage VREF becomes greater, and may change slowly as the level difference between the output data DOUT and the reference voltage VREF becomes smaller.

Referring to FIG. 2, sensing completion detection unit 132 may include, for example but not limited to, an exclusive OR gate 207. The exclusive OR gate 207 may receive the output signals OUT and OUTB and may generate the comparison flag signal COMPF. The sensing completion detection unit 132 may enable the comparison flag signal COMPF when the levels of the output signals OUT and OUTB are different from each other. The comparison flag signal COMPF may be enabled relatively promptly when the level difference between the output data DOUT and the reference voltage VREF is great, and may be enabled relatively slowly as the level difference between the output data DOUT and the reference voltage VREF is small. A voltage supply VDD terminal may be coupled to both the second transistor 203 and the third transistor 205 as illustrated in FIG. 2. A first resistor R1 may be coupled between the voltage supply VDD terminal and the second transistor 203 as illustrated in FIG. 2. A second resistor R2 may be coupled between the voltage supply VDD terminal and the third transistor 205 as illustrated in FIG. 2.

Figure 3:
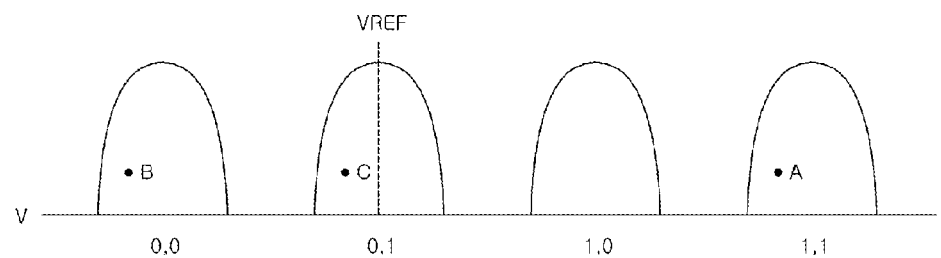
FIG. 3 is a graph illustrating a representation of a voltage distribution of a output data and a reference voltage according to resistance value of a memory cell included in a semiconductor apparatus.

FIG. 3 is a graph illustrating a representation of a voltage distribution of the output data DOUT and the reference voltage VREF according to resistance value of the memory cell 110. Referring to FIG. 3, the x-axis represents a voltage level v, and the distribution represents the voltage levels of the output data DOUT according to the resistance value of the memory cell 110. The memory cell 110 may be a multi-level cell capable of storing multi-level data. The memory cell 110 having data '0, 0' may have the lowest voltage distribution, the memory cell 110 having data '1, 1' may have the highest voltage distribution. When data '0, 1' is written to the memory cell 110 through the write operation, the verification read operation may be performed using the reference voltage VREF having the voltage level falling in the voltage distribution of the memory cell 110 having data '0, 1'. Therefore, the voltage level of the reference voltage VREF, which is used for the verification read operation, may vary according to the input data DIN stored in the memory cell 110 through the write operation.

When the voltage level of the memory cell 110 through the first write operation is 'A' illustrated in FIG. 3, the level difference between the output data DOUT and the reference voltage VREF may be great and the comparison flag signal COMPF may be promptly enabled through the verification read operation. As soon as the comparison flag signal COMPF is enabled, the programming control section 140 may generate the write signal WT for the second write operation and the write driver 120 may write the data '0, 1' into the memory cell 110 again. When the level difference between the output data DOUT and the reference voltage VREF is great, it may be promptly determined that the data written into the memory cell 110 is not the same as the input data DIN or a target level. Therefore, the programming control section 140 may allow the second write operation to be performed promptly after the completion of the first verification read operation.

When the voltage level of the memory cell 110 through the second write operation is 'B' illustrated in FIG. 3, the level difference between the output data DOUT and the reference voltage VREF may be less than the level difference between the output data DOUT and the reference voltage VREF according to the first write operation. After completion of the second verification read operation and a third write operation, the voltage level of the memory cell 110 may be 'C' illustrated in FIG. 3. When it is determined through a third verification read operation that the output data DOUT reaches a target level, the programming operation for storing the data '0, 1' into the memory cell 110 may be completed. As such, in accordance with an embodiment of the present disclosure, the semiconductor memory apparatus 1 may reduce the overall operation time for the programming operation by promptly performing the verification read operation and the following write operation when data stored in the memory cell 110 through the write operation is not the same as intended.

Figure 4:
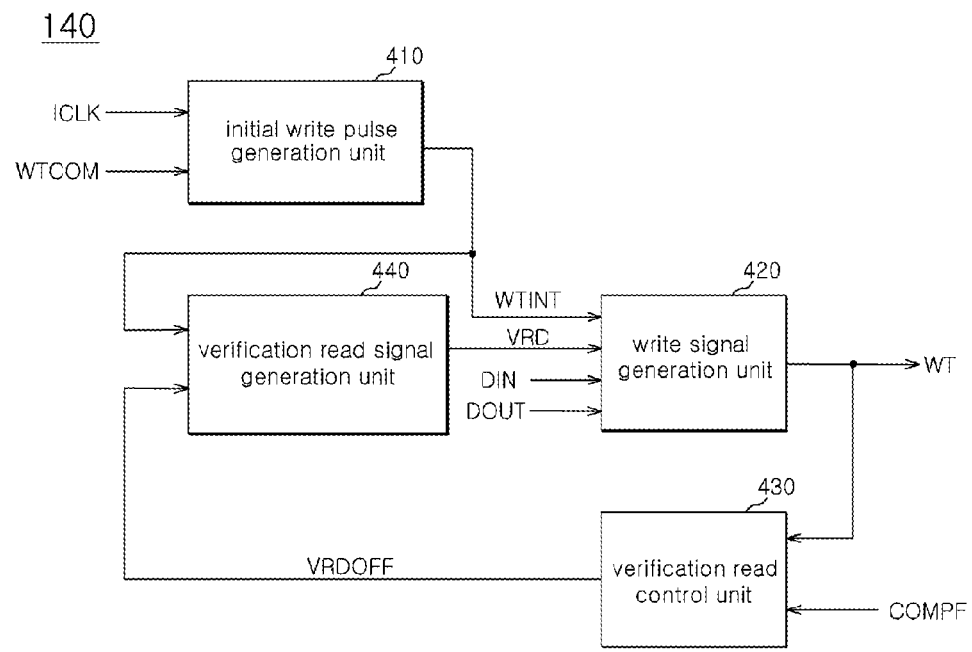
FIG. 4 is a block diagram illustrating a representation of a programming control section illustrated in FIG. 1.

FIG. 4 is a block diagram illustrating the programming control section 140 illustrated in FIG. 1. Referring to FIG. 4, the programming control section 140 may include an initial write pulse generation unit 410, a write signal generation unit 420, and a verification read control unit 430. The programming control section 140 may include a verification read signal generation unit 440. The initial write pulse generation unit 410 may generate an initial write pulse WTINT. The initial write pulse WTINT may be generated in response to the write command WTCOM and an internal clock signal ICLK. The write command WTCOM may be inputted from a device external to the semiconductor memory apparatus 1. For example, the write command WTCOM may be inputted from an external device for the programming operation of the semiconductor memory apparatus 1. The external device may be a host device of the semiconductor memory apparatus 1, and may be one or more of a processor, a memory controller, a test device, and so forth. The internal clock ICLK may be generated on the basis of a clock signal transmitted from the external device. For example, the internal clock signal ICLK may be generated by buffering or dividing the clock signal transmitted from the external device.

The write signal generation unit 420 may generate the write signal WT in response to the initial write pulse WTINT, the input data DIN, the output data DOUT, and the verification read signal VRD. The write signal generation unit 420 may generate the write signal WT for the first write operation based on the initial write pulse WTINT. The write signal generation unit 420 may generate the write signal WT for the second write operation when the verification read signal VRD is disabled. At this time, the write signal generation unit 420 may determine to generate the write signal WT based on the input data DIN and the output data DOUT. In other words, the write signal generation unit 420 may not generate the write signal WT for the following write operation when the input data DIN is the same as the output data DOUT, which is the result of the verification read operation. The write signal generation unit 420 may generate the write signal WT for the following write operation when the input data DIN is not the same as the output data DOUT, which is the result of the verification read operation.

The verification read control unit 430 may generate a verification read termination signal VRDOFF in response to the write signal WT and the comparison flag signal COMPF.

The verification read control unit 430 may disable the verification read termination signal VRDOFF when the write signal WT is disabled. The verification read control unit 430 may enable the verification read termination signal VRDOFF when the comparison flag signal COMPF is enabled.

The verification read signal generation unit 440 may generate the verification read signal VRD in response to the initial write pulse WTINT and the verification read termination signal VRDOFF. The verification read signal generation unit 440 may disable the verification read signal VRD when the initial write pulse WTINT is enabled, and may enable the verification read signal VRD when the initial write pulse WTINT is disabled. The verification read signal generation unit 440 may enable the verification read signal VRD when the verification read termination signal VRDOFF is disabled. The verification read signal generation unit 440 may disable the verification read signal VRD when the verification read termination signal VRDOFF is enabled.

Figure 5:
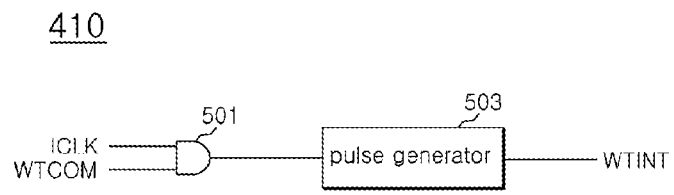
FIG. 5 is a block diagram illustrating a representation of an initial write pulse generation unit illustrated in FIG. 4.

FIG. 5 is a block diagram illustrating a representation of the initial write pulse generation unit 410 illustrated in FIG. 4. Referring to FIG. 5, the initial write pulse generation unit 410 may include a logic gate and a pulse generator 503. The logic gate may be for example but not limited to an AND gate 501. The AND gate 501 may receive the internal clock signal ICLK and the write command WTCOM. The pulse generator 503 may generate the initial write pulse WTINT based on an output of the AND gate 501. When the write command WTCOM has a high level during the internal clock signal ICLK having a high level, the AND gate 501 may output a signal having a high level and the pulse generator 503 may generate the initial write pulse WTINT having a pulse with a high level as enabled.

Figure 6:
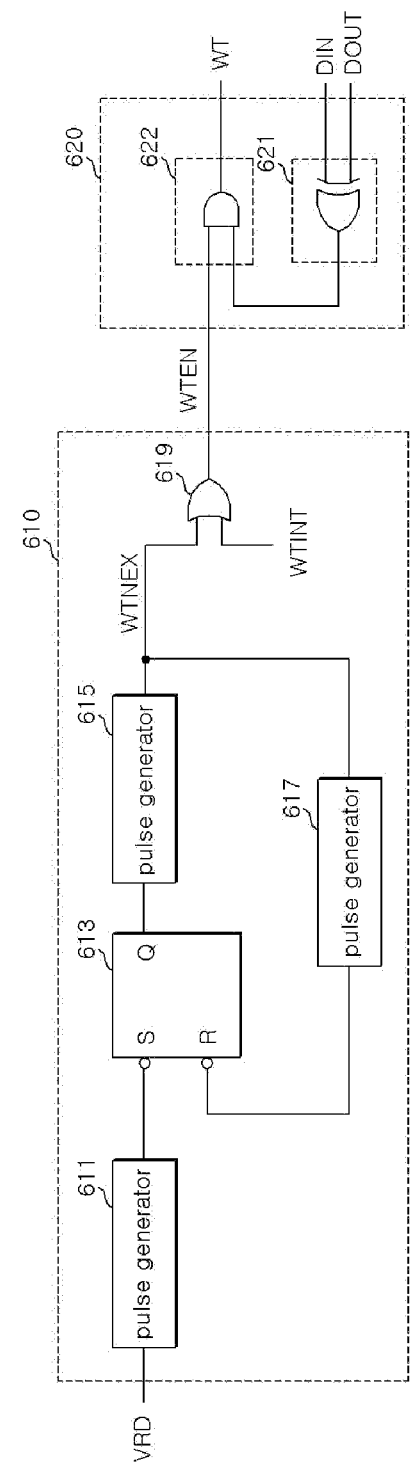
FIG. 6 is a block diagram illustrating a representation of a write signal generation unit illustrated in FIG. 4.

FIG. 6 is a block diagram illustrating a representation of the write signal generation unit 420 illustrated in FIG. 4. Referring to FIG. 6, the write signal generation unit 420 may include a write enable pulse generation part 610 and a write signal output part 620. The write enable pulse generation part 610 may include a plurality of pulse generators 611, 615, and 617. The write enable pulse generation part 610 may include a SR latch 613, and a logic gate. The logic gate may be for example but not limited to an OR gate 619. The first pulse generator 611 may receive the verification read signal VRD, and generate a pulse having a low level as enabled when the verification read signal VRD is disabled. When an output of the first pulse generator 611 is enabled, the SR latch 613 may output a signal having a high level and the second pulse generator 615 may generate a next write pulse WTNEX having a high level as enabled from an output of the SR latch 613. The next write pulse WTNEX may be inputted to the third pulse generator 617, and the third pulse generator 617 may generate a pulse signal having a low level as enabled. The SR latch 613 may receive an output of the third pulse generator 617, and generate a signal having a low level. The OR gate 619 may receive the initial write pulse WTINT and the next write pulse WTNEX, and may output a write enable pulse WTEN. The OR gate 619 may generate the write enable pulse WTEN for the initial write operation based on the initial write pulse WTINT. The OR gate 619 may generate the write enable pulse WTEN for the following write operation based on the next write pulse WTNEX, which is generated in response to the verification read signal VRD.

The write signal output part 620 may generate the write signal WT. The write signal WT may be generated in response to the write enable pulse WTEN, the input data DIN, and the output data DOUT. The write signal output part 620 may include a data comparator 621 and a signal combiner 622. The data comparator 621 may compare the input data DIN with the output data DOUT. The signal combiner 622 may output the write enable pulse WTEN as the write signal WT based on a comparison result of the data comparator 621.

The data comparator 621 may include a logic gate. For example, the data comparator 621 may include an EXCLUSIVE OR gate. The EXCLUSIVE OR gate may output a signal having a high level as enabled when the levels of the input data DIN and the output data DOUT are different to each other. The signal combiner 621 may include a logic gate. For example, the signal combiner 621 may include an AND gate. The AND gate may output the write signal WT by receiving an output of the data comparator 621 and the write enable pulse WTEN.

Figure 7:
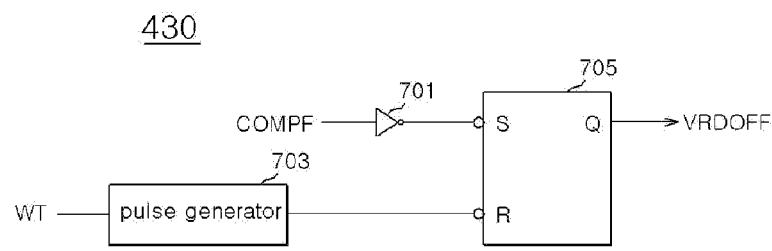
FIG. 7 is a block diagram illustrating a representation of a verification read control unit illustrated in FIG. 4.

FIG. 7 is a block diagram illustrating a representation of the verification read control unit 430 illustrated in FIG. 4. Referring to FIG. 7, the verification read control unit 430 may include an inverter 701, a pulse generator 703, and a SR latch 705. The inverter 701 may invert the comparison flag signal COMPF. The pulse generator 703 may receive the write signal WT, and may generate a pulse having a low level as enabled when the write signal WT is disabled. The SR latch 705 may high-enable the verification read termination signal VRDOFF by receiving an output of the inverter 701 when the comparison flag signal COMPF is enabled. The SR latch 705 may low-disable the verification read termination signal VRDOFF when the output of the pulse generator 703 has low level as enabled.

Figure 8:
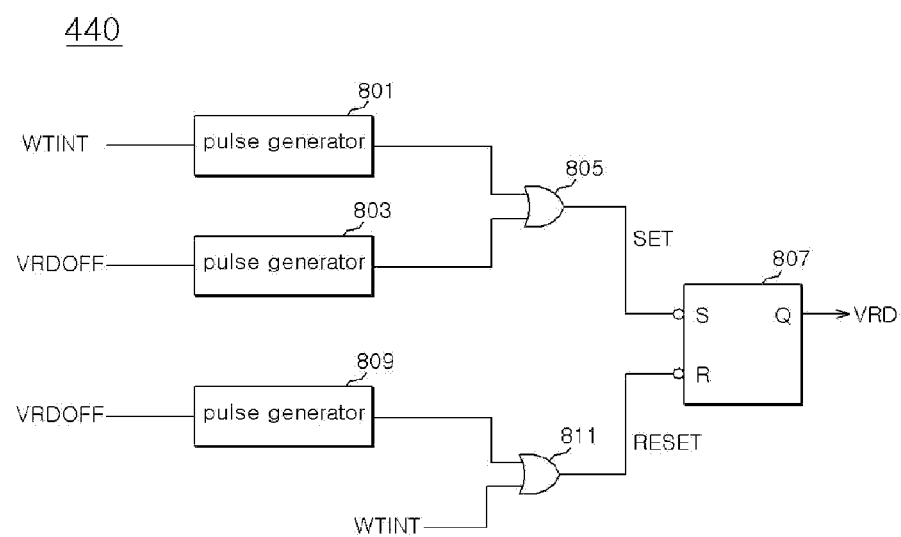
FIG. 8 is a block diagram illustrating a representation of a verification read signal generation unit illustrated in FIG. 4.

FIG. 8 is a block diagram illustrating a representation of the verification read signal generation unit 440 illustrated in FIG. 4. Referring to FIG. 8, the verification read signal generation unit 440 may include a plurality of pulse generators 801, 803, and 809. The verification read signal generation unit 440 may include a plurality of logic gates, for example but not limited to OR gates 805 and 811. The verification read signal generation unit 440 may include a SR latch 807. The first pulse generator 801 may receive the initial write pulse WTINT, and may generate a pulse enabled when the initial write pulse WTINT is disabled. The second pulse generator 803 may receive the verification read termination signal VRDOFF, and may generate a pulse enabled when the verification read termination signal VRDOFF is disabled. The first OR gate 805 may generate a set pulse SET by receiving outputs of the first pulse generator 801 and the second pulse generator 803. The SR latch 807 may high-enable the verification read signal VRD in response to an output of the first OR gate 805. Therefore, the verification read signal generation unit 440 may generate the set pulse SET and enable the verification read signal VRD when the initial write pulse WTINT is disabled or the verification read termination signal VRDOFF is disabled. The third pulse generator 809 may receive the verification read termination signal VRDOFF, and may generate a pulse enabled when the verification read termination signal VRDOFF is enabled. The second OR gate 811 may receive an output of the third pulse generator 809 and the initial write pulse WTINT. The SR latch 807 may low-disable the verification read signal VRD in response to an output of the second OR gate 811. Therefore, the verification read signal generation unit 440 may generate a reset pulse RESET and disable the verification read signal VRD when the initial write pulse WTINT is enabled or the verification read termination signal VRDOFF is enabled.

Figure 9:
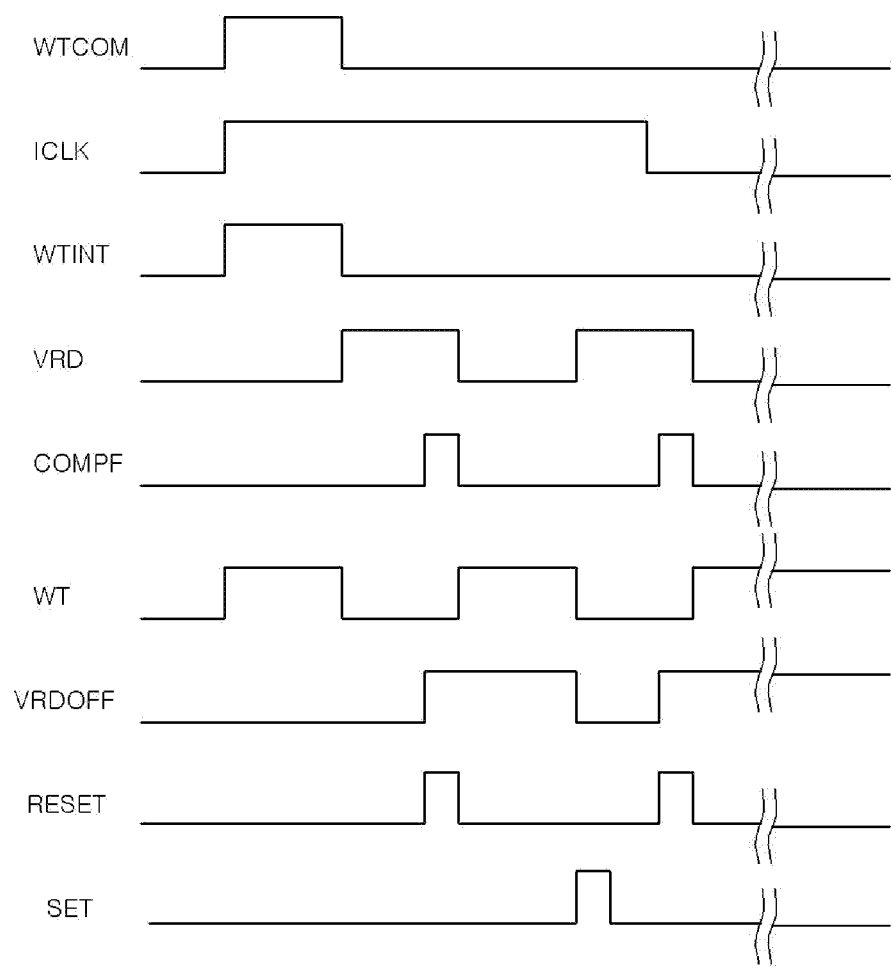
FIG. 9 is a timing diagram illustrating a representation of an operation of a semiconductor memory apparatus in accordance with an embodiment.

FIG. 9 is a timing diagram illustrating a representation of an operation of the semiconductor memory apparatus 1 in accordance with an embodiment of the present disclosure. The operation of the semiconductor memory apparatus 1 in accordance with an embodiment of the present disclosure will be described as follows with reference to FIGS. 1 to 9. When the write command WTCOM is inputted for the program operation of the semiconductor memory apparatus 1, the initial write pulse WTINT may be generated on the basis of the internal clock signal ICLK. In response to the initial write pulse WTINT, the write signal generation unit 420 may enable the write signal WT for the initial write operation and the write driver 120 may write the input data DIN into the memory cell 110. When the write signal WT is disabled, the verification read signal generation unit 440 may enable the verification read signal VRD. When the verification read signal VRD is enabled, the data sensing section 130 may generate the comparison flag signal COMPF by comparing the output data DOUT with the reference voltage VREF. At this time, as described with reference to FIG. 3, when the voltage level difference between the reference voltage VREF and the data stored in the memory cell 110 is great (i.e., case of "A" shown in FIG. 3), the comparison flag signal COMPF may be promptly enabled through the verification read operation. When the comparison flag signal COMPF is enabled, the verification read control unit 430 may enable the verification read termination signal VRDOFF. When the verification read termination signal VRDOFF is enabled, the reset pulse RESET may be enabled and the verification read signal VRD may be disabled. When the verification read signal VRD is disabled, the write enable pulse generation part 610 of the write signal generation unit 420 may enable the write enable pulse WTEN based on the next write pulse WTNEX and the write signal output part 620 may enable the write signal WT.

When the write signal WT is enabled, the second write operation may be performed. The write driver 120 may write the input data DIN into the memory cell 110 in response to the write signal WT. When the write signal WT for the second write operation is disabled, the verification read control unit 430 may disable the verification read termination signal VRDOFF and the set pulse SET may be enabled. When the set pulse SET is enabled, the verification read signal generation unit 440 may enable the verification read signal VRD and the semiconductor memory apparatus 1 may perform the second verification read operation through the data sensing section 130. As described above, the write and verification read operations may be repeatedly performed until the input data DIN written into the memory cell 110 and the output data DOUT readout from the memory cell 110 are substantially the same as each other, and the program operation for writing the input data DIN into the memory cell 110 may be completed when the input data DIN written into the memory cell 110 and the output data DOUT readout from the memory cell 110 are substantially the same as each other.

Figure 10:
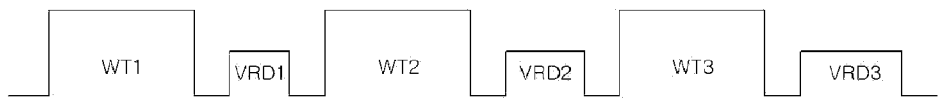
FIG. 10 is an operation time sequence illustrating a representation of an operation of a semiconductor memory apparatus in accordance with an embodiment.

FIG. 10 is an operation time sequence illustrating a representation of an operation of the semiconductor memory apparatus 1 in accordance with an embodiment of the present disclosure. Referring to FIG. 10, a first write operation WT1 may be performed and then a first verification read operation VRD1 may be performed. At this time, the data sensing section 130 may promptly enable the comparison flag signal COMPF, the first verification read operation VRD1 may be promptly ended, and a second write operation WT2 may be performed as soon as the first verification read operation VRD1 is ended when the difference between the voltage level corresponding to data to be written into the memory cell 110 and the voltage level corresponding to data readout from the memory cell 110 is great. Data may be re-written into the memory cell 110 through second and third write operations WT2 and WT3. As data is re-written into the memory cell 110, difference between the voltage level corresponding to data to be written into the memory cell 110 and the voltage level corresponding to data readout from the memory cell 110 may be reduced and thus the time required for second and third verification read operations VRD2 and VRD3 may be longer than the time required for the first verification read operation VRD1. The semiconductor memory apparatus 1 in accordance with an embodiment of the present disclosure may promptly end the verification read operation and promptly perform the following write operation when the difference between the voltage level corresponding to data to be written into the memory cell 110 and the voltage level corresponding to data readout from the memory cell 110 are great, thereby reducing the overall operation time for the programming operation for writing a particular data into the memory cell.

Figure 11:
FIG. 11 is an operation time sequence illustrating a representation of an operation of a semiconductor memory apparatus in accordance with an embodiment.

FIG. 11 is an operation time sequence illustrating a representation of an operation of the semiconductor memory apparatus 1 in accordance with an embodiment of the present disclosure. Referring to FIG. 11, when the first verification read operation VRD1 is promptly completed, the time required for the second verification read operation VRD2 may increase. In this example, an accurate and stable write operation may be performed by securing time for writing data into the memory cell. The semiconductor memory apparatus 1 may increase the time required for the following write operation as the time required for the verification read operation becomes shorter. Therefore, even though overall programming operation time required for writing a particular data into the memory cell may be longer than the case illustrated in FIG. 10, a number of additional write operations and verification read operations may be minimized since data may be accurately and stably written into the memory cell.

Figure 12:
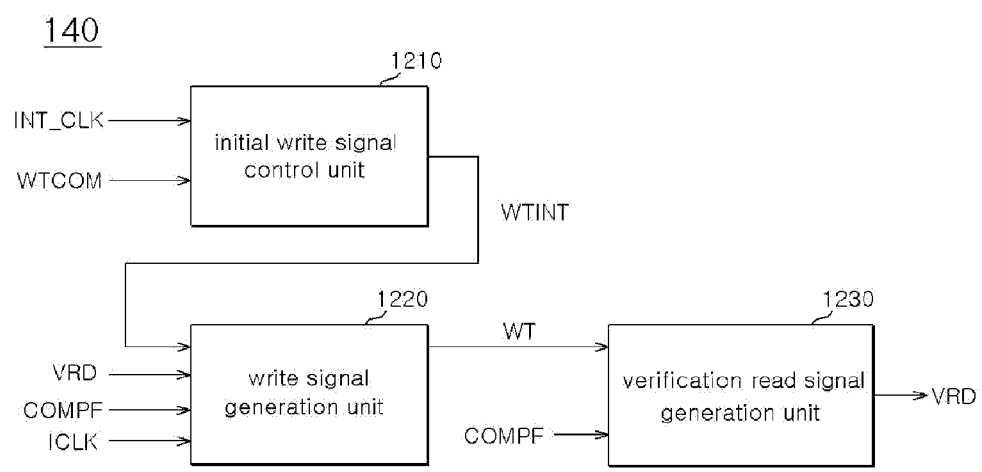
FIG. 12 is a circuit diagram illustrating a representation of a programming control section illustrated in FIG. 1.

FIG. 12 is a circuit diagram illustrating a representation of the programming control section 140 illustrated in FIG. 1. The programming control section 140 may control the semiconductor memory apparatus 1 to perform the programming operation described above with reference to FIG. 11. Referring to FIG. 12, the programming control section 140 may include an initial write signal control unit 1210, a write signal generation unit 1220, and a verification read signal generation unit 1230. The initial write signal control unit 1210 may be substantially the same as the initial write pulse generation unit 410 described above with reference to FIG. 4, and may generate the initial write pulse WTINT in response to the write command WTCOM and the internal clock signal ICLK.

The write signal generation unit 1220 may generate the write signal WT in response to the initial write pulse WTINT, the verification read signal VRD, the comparison flag signal COMPF, and the internal clock signal ICLK. The write signal generation unit 1220 may generate the write signal WT for the first write operation based on the initial write pulse WTINT. The write signal generation unit 1220 may generate the write signal WT for the second write operation when the verification read signal VRD, which is generated by the verification read signal generation unit 1230, is disabled. At this time, the write signal generation unit 1220 may adjust the pulse duration of the write signal WT according to the operation time for the verification read operation. In other words, the write signal generation unit 1220 may adjust the pulse duration of the write signal WT according to the time consumed until the generation of the comparison flag signal COMPF. The write signal generation unit 1220 may count the internal clock signal ICLK from the enablement of the verification read signal VRD to the enablement of the comparison flag signal COMPF, and may adjust the pulse duration of the write signal WT based on result of the count.

The verification read signal generation unit 1230 may generate the verification read signal VRD. The verification read signal VRD may be generated in response to the write signal WT and the comparison flag signal COMPF. The verification read signal generation unit 1230 may enable the verification read signal VRD when the write signal WT is disabled. The verification read signal generation unit 1230 may disable the verification read signal VRD when the comparison flag signal COMPF is enabled.

Figure 13:
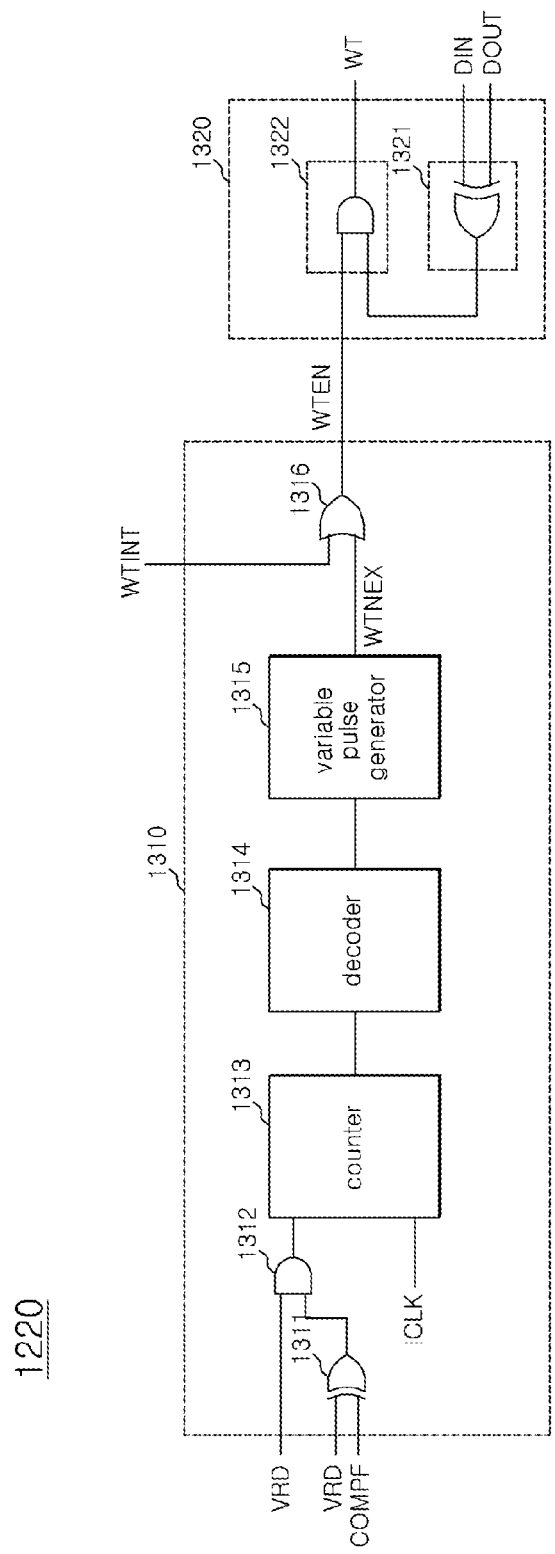
FIG. 13 is a block diagram illustrating a representation of a write signal generation unit illustrated in FIG. 12.

FIG. 13 is a block diagram illustrating a representation of the write signal generation unit 1220 illustrated in FIG. 12. Referring to FIG. 13, the write signal generation unit 1220 may include a write enable pulse generation part 1310 and a write signal output part 1320. The write enable pulse generation part 1310 may include logic gates. For example, the write enable pulse generation part 1310 may include an EXCLUSIVE OR gate 1311, an AND gate 1312, and an OR gate 1316. The write enable pulse generation part 1310 may include a counter 1313, a decoder 1314, and a variable pulse generator 1315. The EXCLUSIVE OR gate 1311 may receive the verification read signal VRD and the comparison flag signal COMPF. The EXCLUSIVE OR gate 1311 may generate an output signal having a high level when the levels of the verification read signal VRD and the comparison flag signal COMPF are different from each other. The AND gate 1312 may receive the verification read signal VRD and an output of the EXCLUSIVE OR gate 1311. The EXCLUSIVE OR gate 1311 and the AND gate 1312 may generate signals having a high level when the verification read signal VRD is enabled. The EXCLUSIVE OR gate 1311 and the AND gate 1312 may generate signals having a low level when the comparison flag signal COMPF is enabled.

The counter 1313 may receive the internal clock signal ICLK and an output of the AND gate 1312. The counter 1313 may count the internal clock signal ICLK from when the output of the AND gate 1312 has a high level to when the output of the AND gate 1312 has a low level. Therefore, the counter 1313 may count the internal clock signal ICLK from when the verification read signal VRD is enabled to when the comparison flag signal COMPF is enabled. The counter 1313 may count the internal clock signal ICLK in order to count time from the start of the verification read operation to the generation of the comparison flag signal COMPF.

The decoder 1314 may decode an output of the counter 1313. According to an output of the decoder 1314, the variable pulse generator 1315 may generate the next write pulse WTNEX for the following write operation after the first write operation by selecting a particular pulse duration. The variable pulse generator 1315 may include a lookup table for the generation of the next write pulse WTNEX having the pulse duration. The pulse duration may vary according to the output of the decoder 1314. For example, the variable pulse generator 1315 may generate the next write pulse WTNEX having a relatively long pulse duration when the time from the start of the verification read operation to the enablement of the comparison flag signal COMPF is relatively short, and may generate the next write pulse WTNEX having a relatively short pulse duration when the time from the start of the verification read operation to the enablement of the comparison flag signal COMPF is relatively long. The OR gate 1316 may receive the initial write pulse WTINT and the next write pulse WTNEX, and may output the write enable pulse WTEN.

The write signal output part 1320 may include a data comparator 1321 and a signal combiner 1322. The data comparator 1321 may include a logic gate. For example the data comparator 1321 may include an EXCLUSIVE OR gate. The data comparator 1321 may compare the levels of the input data DIN and the output data DOUT. The data comparator 1321 may output a signal having a high level when the levels of the input data DIN and the output data DOUT are different to each other. The signal combiner 1321 may include a logic gate. For example, the signal combiner 1321 may include an AND gate. The signal combiner 1321 may output the write signal WT by receiving an output of the data comparator 1321 and the write enable pulse WTEN. The data comparator 1321 and the signal combiner 1322 may generate the write signal WT from the write enable pulse WTEN only when the levels of the input data DIN and the output data DOUT are different from each other.

Figure 14:
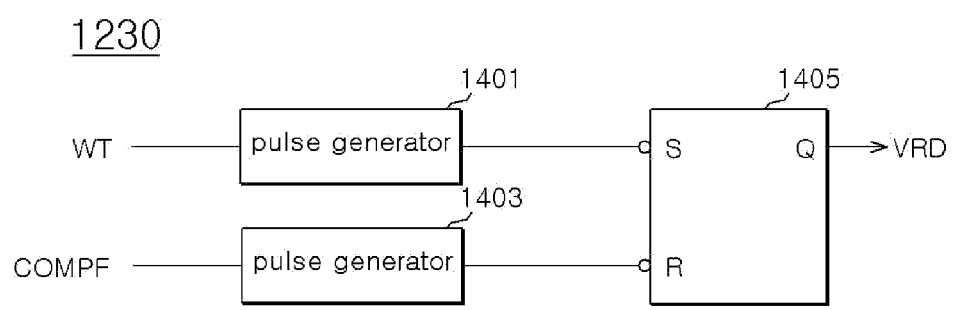
FIG. 14 is a block diagram illustrating a representation of a verification read signal generation unit illustrated in FIG. 12.

FIG. 14 is a block diagram illustrating a representation of the verification read signal generation unit 1230 illustrated in FIG. 12. Referring to FIG. 14, the verification read control unit 1230 may include a plurality of pulse generators 1401 and 1403, and a SR latch 1405. The first pulse generator 1401 may receive the write signal WT. The first pulse generator 1401 may generate a pulse enabled when the write signal WT is disabled. The second pulse generator 1403 may receive the comparison flag signal COMPF. The second pulse generator 1403 may generate a pulse enabled when the comparison flag signal COMPF is enabled. The SR latch 1405 may enable the verification read signal VRD when the pulse outputted from the first pulse generator 1401 is enabled. The SR latch 1405 may disable the verification read signal VRD when the pulse outputted from the first pulse generator 1403 is enabled. Therefore, the verification read signal generation unit 1230 may enable the verification read signal VRD until the comparison flag signal COMPF is enabled after the write operation is completed.

Figure 15:
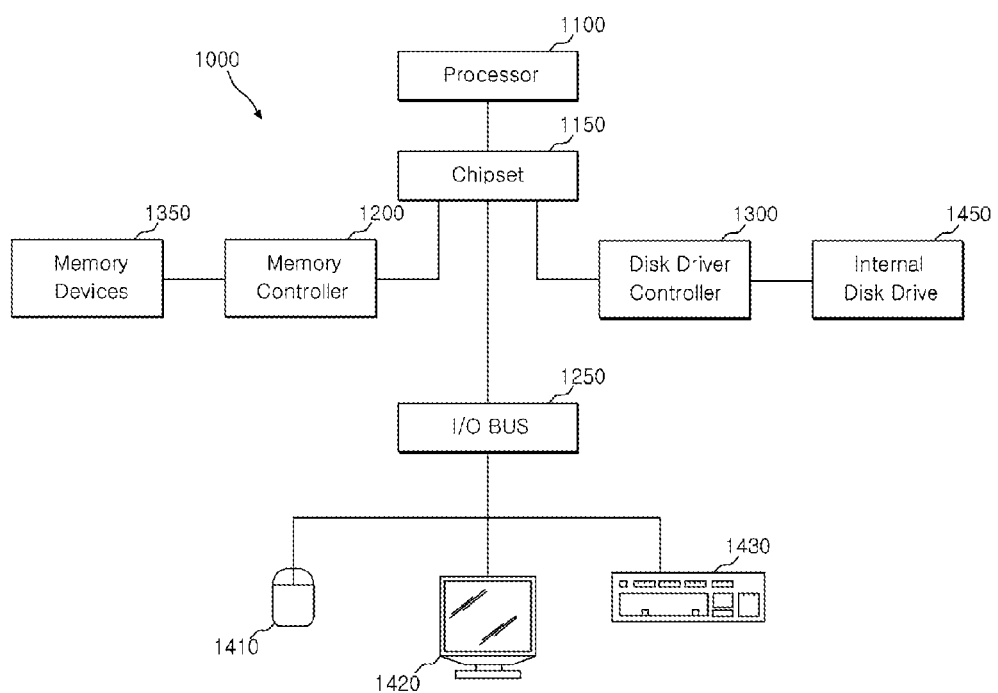
FIG. 15 illustrates a block diagram of an example of a representation of a system employing the semiconductor memory apparatus in accordance with the embodiments discussed above with relation to FIGS. 1-14.

The semiconductor memory apparatuses discussed above (see FIGS. 1-14) are particular useful in the design of memory devices, processors, and computer systems. For example, referring to FIG. 15, a block diagram of a system employing the semiconductor memory apparatuses in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor memory apparatus as discussed above with reference to FIGS. 1-14. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor memory apparatus as discussed above with relation to FIGS. 1-14, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 15 is merely one example of a system employing the semiconductor memory apparatuses as discussed above with relation to FIGS. 1-14. In alternate embodiments, such as cellular phones or digital cameras, the components may differ from the embodiments illustrated in FIG. 15.

While certain embodiments have been described above, it will be understood to those skilled in the art that the embodiments described are by way of example only. Accordingly, the semiconductor memory apparatus should not be limited based on the described embodiments.

What is claimed is:

1. A semiconductor memory apparatus comprising:
a write driver configured to write an input data into a memory cell in response to a write signal;
a data sensing section configured to generate a comparison flag signal by comparing an output data outputted from the memory cell with a reference voltage in response to a verification read signal; and
a programming control section configured to generate the write signal for a following write operation as soon as the comparison flag signal is enabled.

2. The semiconductor memory apparatus of claim 1, wherein the data sensing section comprises:
a sense amplifier configured to generate an output signal by differentially amplifying the output data and the reference voltage in response to the verification read signal; and
a sensing completion detection unit configured to generate the comparison flag signal by sensing a level change of the output signal.

3. The Semiconductor memory apparatus of claim 1, wherein the programming control section is configured to generate the write signal for an initial write operation and the verification read signal in response to a write command, and to generate the write signal for the following write operation as soon as the comparison flag signal is enabled.

4. The semiconductor memory apparatus of claim 3, wherein the programming control section comprises:
an initial write pulse generation unit configured to generate an initial write pulse in response to the write command and an internal clock signal;
a write signal generation unit configured to generate the write signal in response to the initial write pulse, the verification read signal, the input data, and the output data;
a verification read control unit configured to generate a verification read termination signal in response to the write signal and the comparison flag signal; and
a verification read signal generation unit configured to generate the verification read signal in response to the initial write pulse and the verification read termination signal.

5. The semiconductor memory apparatus of claim 4, wherein the write signal generation unit comprises:
a write enable pulse generation part configured to generate a write enable pulse based on a next write pulse and the initial write pulse; and
a write signal output part configured to generate the write signal based on the input data, the output data, and the write enable pulse,
wherein the next write pulse is enabled when the verification read signal is disabled.

6. The semiconductor memory apparatus of claim 5, wherein the write signal output part generates the write signal based on the write enable pulse when levels of the output data and the input data are different from each other.

7. The semiconductor memory apparatus of claim 5, wherein the write signal output part comprises:
a data comparator configured to compare the levels of the input data and the output data; and
a signal combiner configured to provide the write enable pulse as the write signal based on a comparison result generated from the data comparator comparing the levels of the input data with the output data.

8. The semiconductor memory apparatus of claim 4, wherein the verification read control unit disables the verification read termination signal when the write signal is disabled, and enables the verification read termination signal when the comparison flag signal is at the predetermined level.

9. The semiconductor memory apparatus of claim 8, wherein the verification read signal generation unit enables the verification read signal based on disablement of the initial write pulse and disablement of the verification read termination signal, and disables the verification read signal based on enablement of the initial write pulse and enablement of the verification read termination signal.

10. A semiconductor memory apparatus including a memory cell and configured to write an input data into the memory cell in response to a write signal, and generate a following write signal as soon as a comparison flag signal is at a predetermined level after comparing an output data outputted from the memory cell with a reference voltage, wherein the pulse duration of the following write signal is adjusted based on the comparison flag signal.

11. The semiconductor memory apparatus of claim 10, further comprising:
a write driver configured to write the input data into the memory cell in response to the write signal;
a data sensing section configured to generate the comparison flag signal by comparing the output data outputted from the memory cell with the reference voltage in response to a verification read signal; and
a programming control section configured to generate the write signal for an initial write operation and the verification read signal in response to a write command, and generate the following write signal as soon as the comparison flag signal is at the predetermined level,
wherein the programming control section adjusts a pulse duration of the write signal based on time for generation of the comparison flag signal.

12. The semiconductor memory apparatus of claim 11, wherein the data sensing section comprises:
a sense amplifier configured to generate an output signal by differentially amplifying the output data and the reference voltage in response to the verification read signal; and
a sensing completion detection unit configured to generate the comparison flag signal by sensing a level change of the output signal.

13. The semiconductor memory apparatus of claim 11, wherein the programming control section comprises:
an initial write pulse generation unit configured to generate an initial write pulse in response to the write command and an internal clock signal;
a write signal generation unit configured to generate the write signal and the following write signal in response to the initial write pulse, the verification read signal, the comparison flag signal, and the internal clock signal; and
a verification read signal generation unit configured to generate the verification read signal in response to the write signal and the comparison flag signal.

14. The semiconductor memory apparatus of claim 13, wherein the write signal generation unit comprises:

a write enable pulse generation part configured to generate a next write pulse having pulse duration varying based on time from when the verification read signal is enabled to when the comparison flag signal is enabled, and generate a write enable pulse based on the initial write pulse, and the next write pulse; and
a write signal output part configured to generate the write signal based on the input data, the output data, and the write enable pulse.

15. The semiconductor memory apparatus of claim 14, wherein the write enable pulse generation part comprises:
a counter configured to count time through the internal clock signal from when the verification read signal is enabled to when the comparison flag signal is enabled; and
a variable pulse generator configured to adjust the pulse duration of the next write pulse based on an output of the counter.

16. The semiconductor memory apparatus of claim 15, wherein the variable pulse generator configured to decrease the pulse duration of the next write pulse as the time increases, and increase the pulse duration of the next write pulse as the time decreases.

17. The semiconductor memory apparatus of claim 14, wherein the write signal output part generates the write signal based on the write enable pulse when levels of the output data and the input data are different from each other.

18. The semiconductor memory apparatus of claim 14, wherein the write signal output part comprises:
a data comparator configured to compare the levels of the input data and the output data; and
a signal combiner configured to provide the write enable pulse as the write signal based on a comparison result generated from the data comparator comparing the levels of the input data with the output data.

19. The semiconductor memory apparatus of claim 13, wherein the verification read signal generation unit enables the verification read signal when the write signal is disabled, and disables the verification read signal when the comparison flag signal is at the predetermined level.

* * * * *